United States Patent
Shi et al.

(10) Patent No.: US 8,222,714 B2
(45) Date of Patent: Jul. 17, 2012

(54) SEMICONDUCTOR PACKAGE WITH EMBEDDED SPIRAL INDUCTOR

(75) Inventors: Hao Shi, Mountain View, CA (US); Jung-Hoon Chun, Mountain View, CA (US); Xingchao Yuan, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 369 days.

(21) Appl. No.: 12/523,587

(22) PCT Filed: Feb. 4, 2008

(86) PCT No.: PCT/US2008/052926
§ 371 (c)(1),
(2), (4) Date: Jul. 17, 2009

(87) PCT Pub. No.: WO2008/097911
PCT Pub. Date: Aug. 14, 2008

(65) Prior Publication Data
US 2010/0096725 A1  Apr. 22, 2010

Related U.S. Application Data

(60) Provisional application No. 60/888,249, filed on Feb. 5, 2007, provisional application No. 60/957,996, filed on Aug. 24, 2007.

(51) Int. Cl.
*H01L 27/08* (2006.01)
(52) U.S. Cl. ......... 257/531; 257/E21.022; 257/E23.023; 438/613
(58) Field of Classification Search .................. 257/531, 257/E21.508, E23.023, E21.022; 438/613
See application file for complete search history.

(56) References Cited

U.S. PATENT DOCUMENTS

| | | | |
|---|---|---|---|
| 6,362,525 B1 * | 3/2002 | Rahim | 257/738 |
| 6,469,383 B1 | 10/2002 | Welstand | 257/737 |
| 2004/0041011 A1 * | 3/2004 | Bolde et al. | 228/264 |
| 2006/0227522 A1 * | 10/2006 | Huang et al. | 361/782 |

FOREIGN PATENT DOCUMENTS

JP  2006 286857 A  10/2006

OTHER PUBLICATIONS

International Search Report and Written Opinion issued in PCT/US2008/052926, Jun. 24, 2008, 11 pages, by ISA/EP.

* cited by examiner

*Primary Examiner* — Stephen W Smoot
*Assistant Examiner* — Vicki B Booker
(74) *Attorney, Agent, or Firm* — Morgan, Lewis & Bockius LLP

(57) ABSTRACT

In some embodiments, the semiconductor package includes a substrate having multiple layers, from a first layer to a final layer, a die coupled to the first layer, an electrical connector such as a solder ball coupled to the final layer, and a spiral trace disposed and electrically coupled between the die and the electrical connector. Inductance of the spiral trace is selected such that the package has a predetermined impedance. Material, cross-sectional area, number and density of windings, and total overall length of the spiral trace are selected accordingly. In other embodiments, the semiconductor package includes a substrate with multiple layers; a die coupled to the first of the layers; an electrical connector coupled to the final layer; and a spiral trace, in or on the substrate. The spiral trace is near the die, and electrically coupled between the die and the electrical connector.

29 Claims, 11 Drawing Sheets

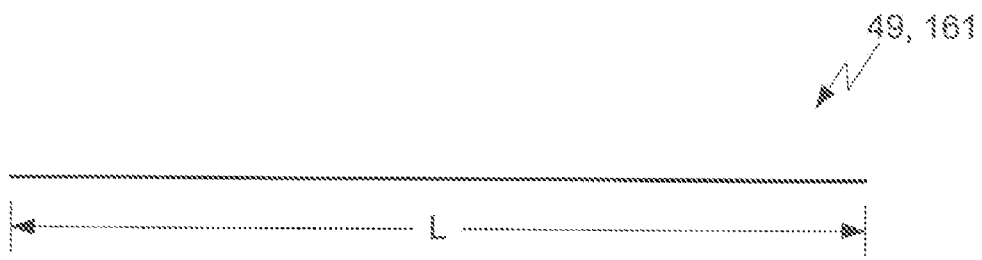
FIG. 4A
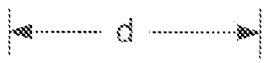
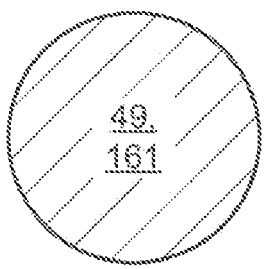
FIG. 4B
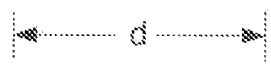
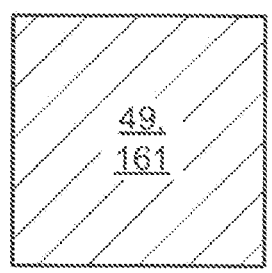
FIG. 4C

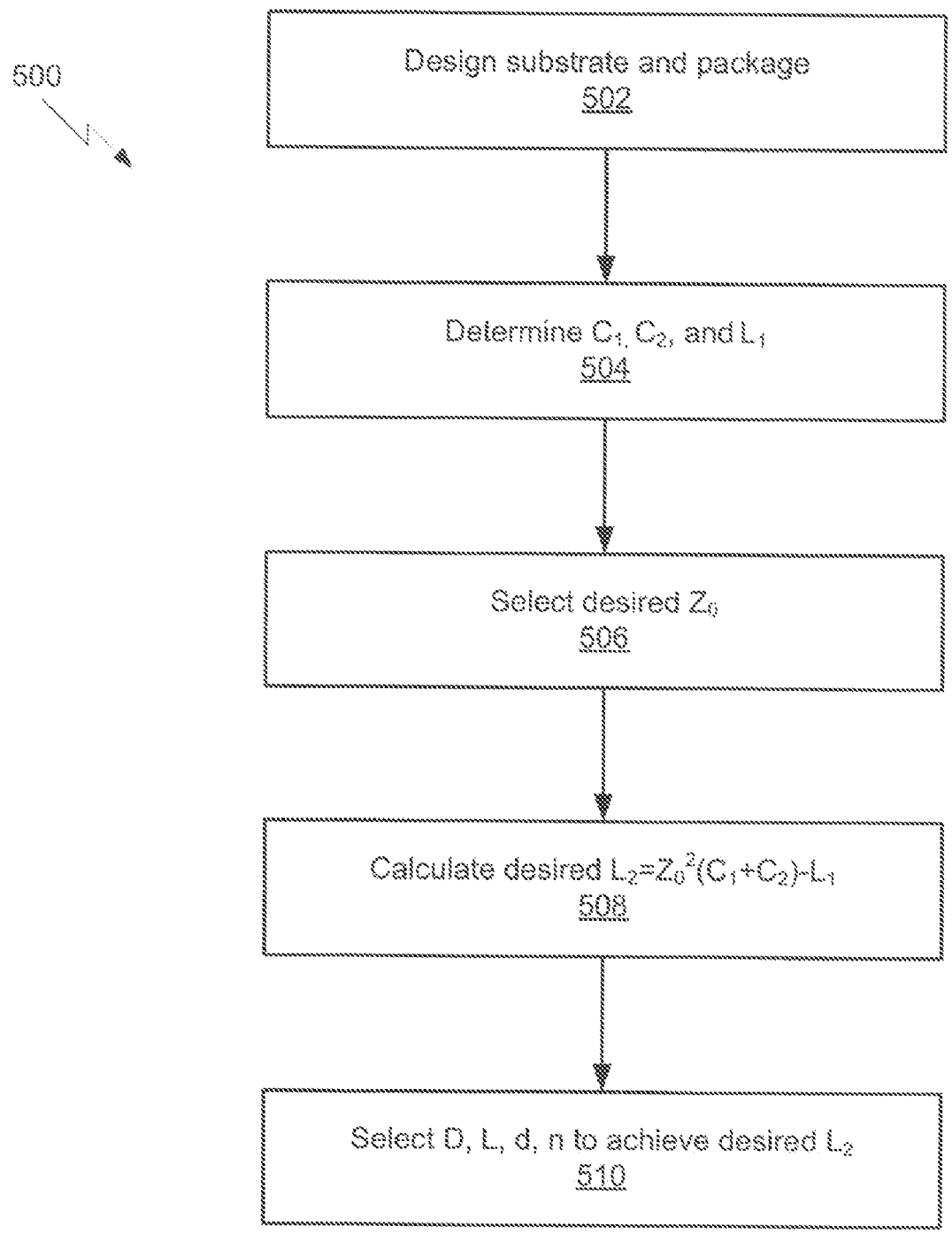

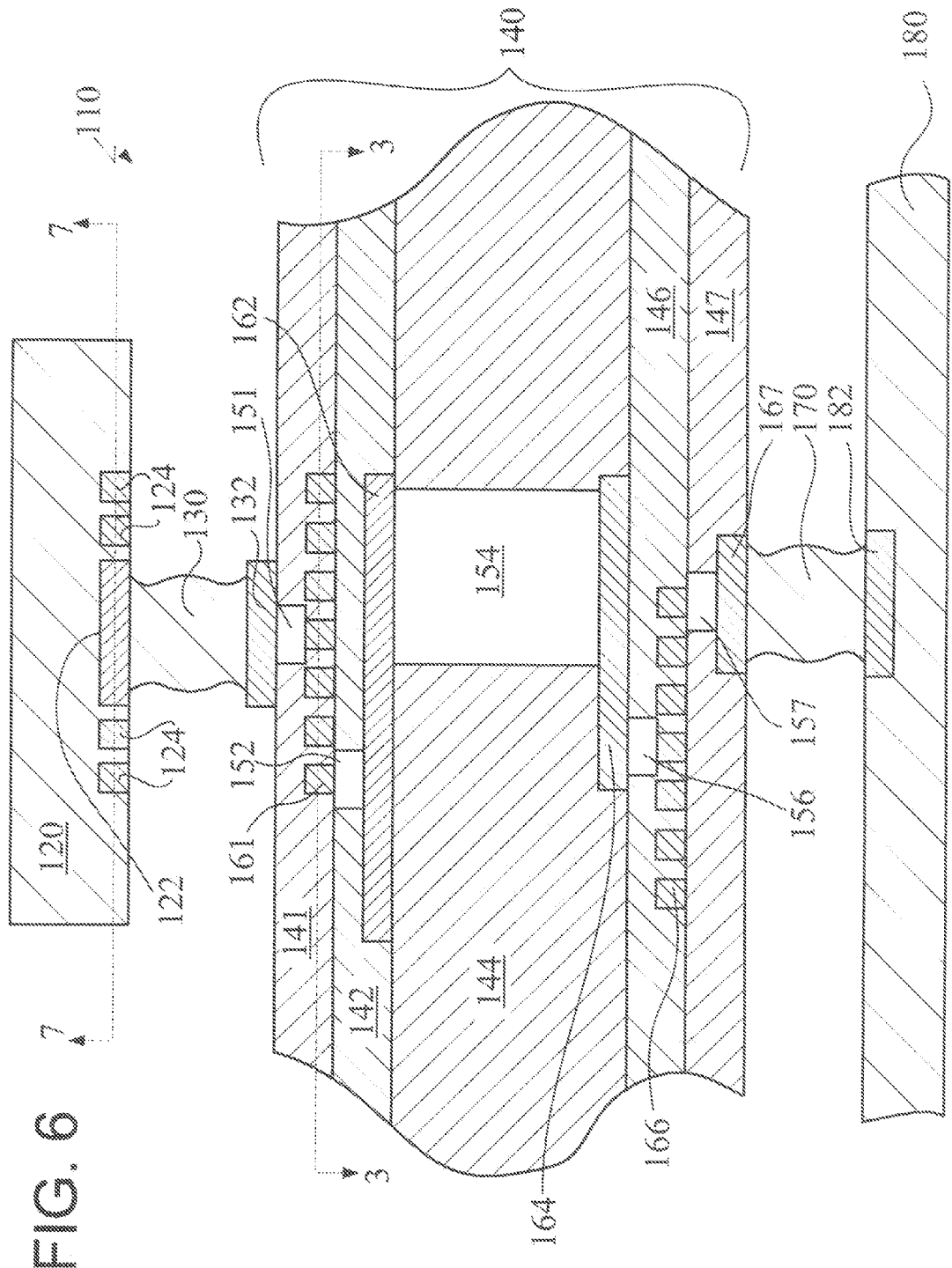

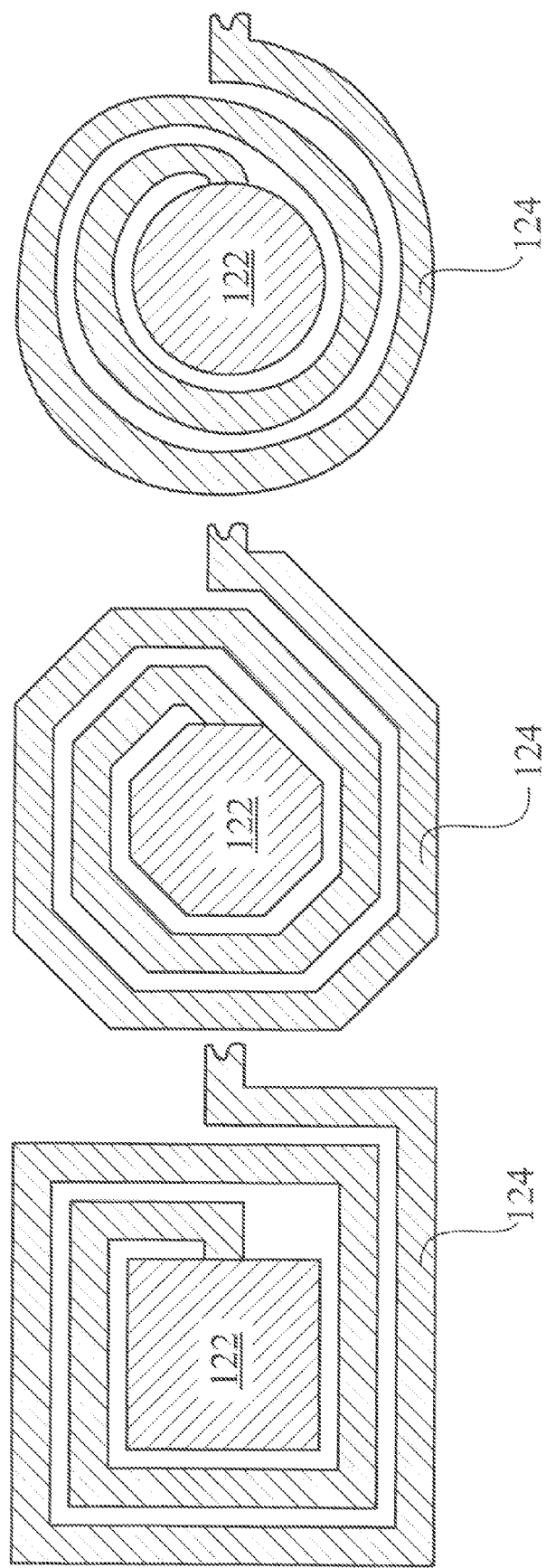

SEMICONDUCTOR PACKAGE WITH EMBEDDED SPIRAL INDUCTOR

CROSS REFERENCE TO RELATED APPLICATIONS

This Application is a United States National Stage Application filed under 35 U.S.C. §371 of PCT Patent Application Serial No. PCT/US2008/052926 filed on Feb. 4, 2008, which claims the benefit of and priority to U.S. Provisional Patent Application Ser. No. 60/888,249 filed on Feb. 5, 2007, and 60/957,996 filed on Aug. 24, 2007, the disclosures of which are hereby incorporated by reference in their entirety.

BACKGROUND

The disclosure herein relates to a semiconductor package, and more particularly to a semiconductor package that includes a spiral inductor that is used to (i) adjust the package's impedance, or (ii) compensate for excess capacitance of the semiconductor device in the package.

Integrated circuit (IC) packages are enclosures that house one or more semiconductor devices, otherwise known as IC dies. An IC die is typically a single square or rectangular piece of semiconductor material in which various microelectronic circuits have been formed. An IC package serves to both protect the IC die contained therein from physical and environmental damage and physically and electrically connect the IC die to a printed circuit board (PCB).

Recently, multi-layered packages have been introduced. The overall footprints of the interconnect topologies of these multi-layer packages have been steadily decreasing to meet demands for smaller overall package form factors. This reduction has led to low inductances in the overall signal path of the package, which, in turn, leads to a low impedance in the overall signal path of the package. This low impedance in the overall signal path may cause undesirable impedance mismatches with the IC dies in the packages and with the PCBs to which the packages are connected. These problems are exacerbated in systems having high signaling speeds, such as speeds on the order of multiple gigahertz. In these high-speed systems, even a small impedance mismatch may cause severe signaling problems.

BRIEF DESCRIPTION OF THE DRAWINGS

FIG. 4A is a side view of a spiral inductor according to an exemplary embodiment in the unwound state;

FIGS. 4B and 4C are cross-sectional views of the spiral inductor shown in FIG. 4A;

FIG. 5 is a flowchart depicting an exemplary design process of a semiconductor package according to exemplary embodiments;

FIG. 6 is a cross-sectional view of a package structure according to another exemplary embodiment;

FIGS. 7A-7C are top views of a spiral inductor and solder pad, along line 7-7 of FIG. 6, according to exemplary embodiments;

DETAILED DESCRIPTION

The exemplary embodiments described below address the problems of the prior art by providing a semiconductor package with an embedded spiral inductor or trace that is selected to provide a desired impedance and/or other electrical characteristics to the package.

Exemplary embodiments described herein provide a spiral trace on or in one or more substrate layers of an IC package. The spiral trace acts as an inductor that can compensate for large capacitances in the package, thereby maintaining a desired characteristic impedance. The spiral takes up very little area, and its ends (input and output) are near one another. During the design of the package, the characteristics of the spiral are chosen so as to provide a desired inductance, thereby providing a desired impedance of the package as a whole.

In some embodiments, the package includes a die physically and electrically connected to a die pad on a top layer of a multi-layer substrate. An electrical interconnect path through the layers connects the die pad to a solder pad on the bottom layer. The solder pad may be physically and electrically connected to a solder ball or the like, which in use, is physically and electrically connected to a PCB.

In some embodiments, the interconnect paths are composed of electrically conductive signal traces ("traces") and electrically conductive vias. In general, the traces are disposed substantially horizontally along or between the various substrate layers, i.e., substantially parallel to the planar surface of the substrate, while the vias are disposed substantially vertically through the layers, i.e., substantially perpendicular to the planar surface of the substrate.

In some embodiments, the solder ball has a lower size limit due to thermal and mechanical reliability considerations. For example, the solder ball cannot be so small as to compromise the electrical and mechanical connection between the substrate and the PCB. As such, the capacitance of the solder ball generally has a lower limit. This leads to the package structure having a low impedance caused by the high capacitance of the solder ball:

$$Z_0 = \sqrt{\frac{L}{C}}$$

where:
$Z_0$ is the impedance;
L is the inductance; and
C is the capacitance.

As mentioned above, a low impedance in the overall signal path tends to cause undesirable impedance mismatches with the IC dies in the package and with the PCBs to which the packages are connected.

Figure 1:
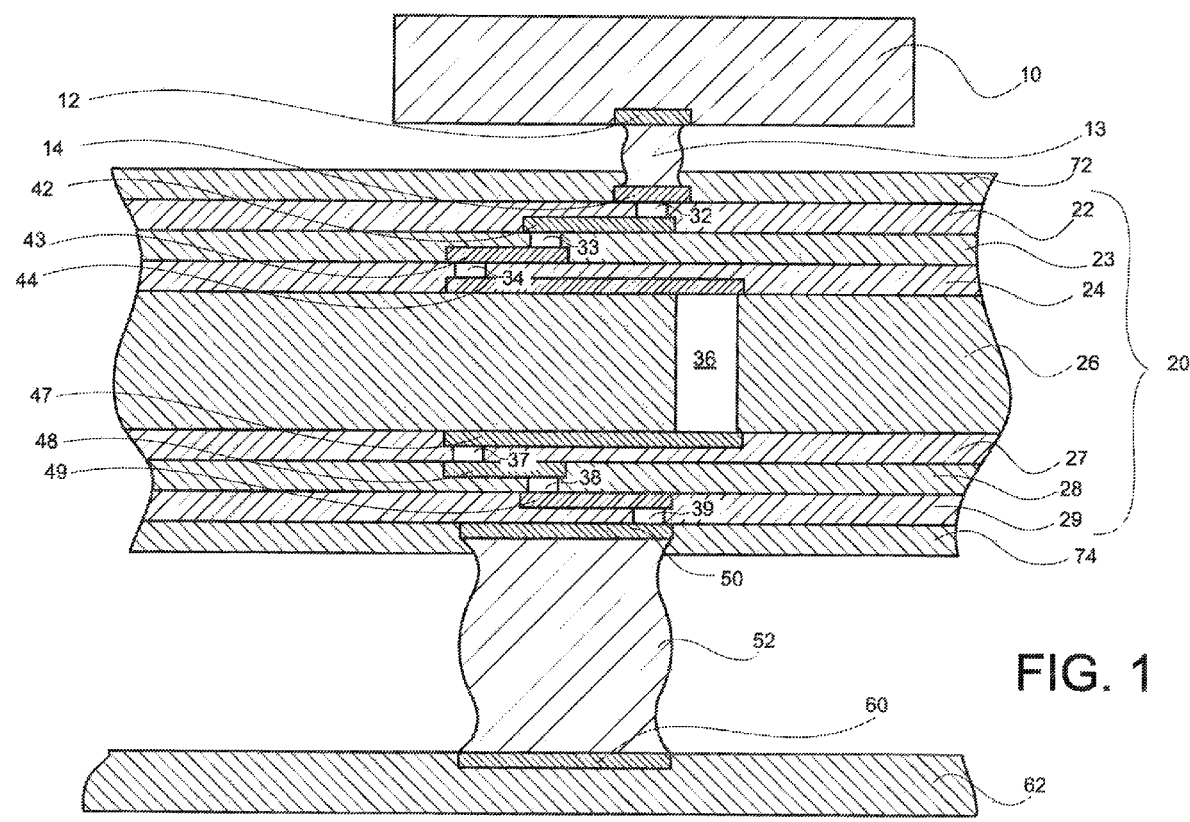
FIG. 1 is a cross-sectional view of a package structure according to an exemplary embodiment.

As shown in FIG. 1, a die pad 14 of a substrate 20 may be physically and electrically connected to a contact pad 12 of an IC die 10 using, for example, a solder ball 13 or solder bump (not shown). In some embodiments, die 10 may be a memory die. Similarly, a solder ball 52 or solder bump (not shown) physically and electrically connects the solder pad 50 to a contact pad 60 on the PCB 62. These solder balls or bumps will typically be applied to the IC die 10 and the substrate 20 before the package is assembled.

In some embodiments, the substrate 20 includes a number of contiguous dielectric layers. Specifically, in the embodiment shown, the substrate 20 includes: three upper dielectric buildup layers 22, 23, 24, a dielectric core layer 26, three lower dielectric buildup layers 27, 28, 29, and two dielectric solder mask layers 72, 74. It should be appreciated that other embodiments of the substrate may include different numbers and arrangements of dielectric layers. Located within the upper buildup layers 22, 23, 24 are micro-vias (also called build-up vias) 32, 33, 34 respectively. Located within the core layer 26 is core via 36. Located within the lower buildup layers 27, 28, 29 are micro-vias 37, 38, 39, respectively. In some embodiments, the micro-via is a blind via with a diameter of approximately 30-50 µm or less that is usually drilled from the top and/or bottom layer(s) to the first or second adjacent internal layer. Also in some embodiments, the adjacent internal layers can be used to redistribute the signals to other areas of the substrate where conventional through-hole vias can be used. Compared to conventional plated through-holes, micro-vias offer a distinct advantage in terms of overall board size reduction, layer count reduction and increased route or interconnect density.

In general, the core layer serves as a relatively rigid structure upon which the various buildup layers are formed or connected. As such, in some embodiments, the core layer is significantly thicker than any of the buildup layers. The core layer 26 and the upper and lower buildup layers 22, 23, 24, 27, 28, 29 may be composed of various dielectric materials, having appropriate properties for use in multi-layer substrates.

With respect to the vias, each via forms an electrically conductive path of connection through one of the substrate layers. Each via may include a central, or "drill" portion, an upper pad, and a lower pad. The vias are formed in via holes that are formed or drilled in the substrate 20. The via holes may be formed using a number of techniques. For example, and without limitation, the via holes may be formed using various mechanical drilling, laser drilling, or photolithographic techniques. However, given the relatively small diameters of the micro-vias (~30-50 µm), the via holes for the micro-vias will typically be made using either laser drilling or photolithographic techniques.

After the via holes have been formed in the various layers, the vias are then formed in the via holes by depositing one or more electrically conductive materials, such as copper or the like, into the via holes. The electrically conductive material may fill the via holes completely, or the electrically conductive material may only line the via holes, leaving a hollow space in the electrically conductive material. In the case where the electrically conductive material only lines the via holes, the hollow space within the vias may be filled with various dielectric materials, or left hollow. The electrically conductive material may be applied or deposited in the via holes using a number of different techniques, including plating or paste filling.

As previously noted, each of the vias along each interconnect path is electrically connected to at least one other via in an adjoining dielectric layer by an electrically conductive trace. The traces may be formed using photolithography, laser etching, or other methods. The traces may be composed of various electrically conductive materials, such as copper or the like. It should be appreciated that while eight metal layers are shown in FIG. 1, other embodiments may include different numbers and arrangements of metal or conductive layers.

With respect to the specific interconnections of the trace/via path, in the illustrated embodiment, micro-via 32 is connected to micro-via 33 by trace 42; micro-via 33 is connected to micro-via 34 by trace 43; micro-via 34 is connected to core via 36 by trace 44; core via 36 is connected to micro-via 37 by trace 47; micro-via 37 is connected to micro-via 38 by trace 48; and micro-via 38 is connected to micro-via 39 by spiral trace 49, as described below. Additionally, the uppermost micro-via 32 is connected to the substrate die pad 14. In the illustrated embodiment, micro-via 32 is connected directly to substrate die pad 14. However, micro-via 32 could also be connected to pad 14 by a trace on the upper surface of layer 22. The lowermost micro-via 39 is connected to the solder pad 50 of the substrate 20. In the illustrated embodiment, micro-via 39 is connected directly to solder pad 50. However, micro-via 39 could also be connected to solder pad 50 by a trace on the lower surface of layer 29.

Having generally described the substrate 20 and the trace/via path, various parameters will now be described for constructing a substrate 20 including a model trace/via path. The model trace/via path that will now be described achieves an overall impedance of approximately $Z_0$ (such as 50 ohms) for single-ended signaling, or $2Z_0$ (such as 100 ohms) for differential signaling, while still maintaining a relatively narrow trace/via path topology.

As will be appreciated by those skilled in the art, the impedance of a typical PCB is approximately $Z_0$ (such as 50 ohms) for single-ended signaling and approximately $2Z_0$ (such as 100 ohms) for a differential scheme. As such, use of the controlled impedance trace/via path is particularly useful in multi-layer IC die packages. The desirability of the controlled impedance trace/via path is further enhanced, as it may be manufactured using standard substrate manufacturing processes and materials. However, it should be appreciated that the disclosure herein is not limited to an impedance of 50 ohms, and may have any appropriate impedance selected for its intended application.

Figure 2:
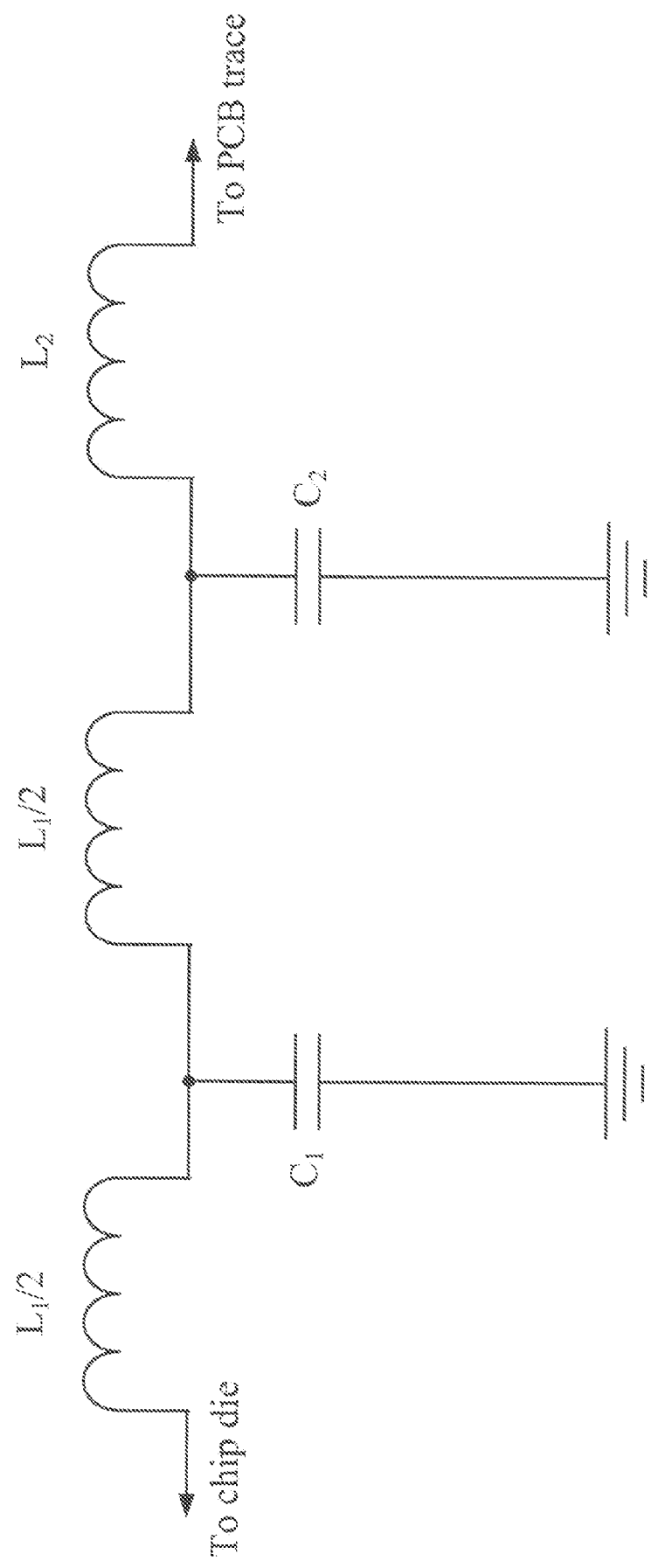
FIG. 2 is a schematic diagram showing the electrical characteristics of an exemplary embodiment.

The electrical characteristics of the structure of FIG. 1 can be approximated by the circuit shown schematically in FIG. 2. The impedance of the structure is thus $$Z_0 = \sqrt{\frac{L_1 + L_2}{C_1 + C_2}}$$

where:

$Z_0$ is the impedance;

$L_1$ is the total inductance of the vias and traces other than the spiral trace, which may in some applications be approximated as the inductance of the core via;

$L_2$ is the inductance of the spiral trace;

$C_1$ is the capacitance of the vias and traces, which may in some applications be approximated as the capacitance of the core via; and $C_2$ is the capacitance of the solder ball.

Generally, $L_1$, $C_1$, and $C_2$ are often fixed, with $C_2$ often comprising a relatively large capacitance due to the solder ball size. Therefore to compensate for the undesirably large $C_2$ capacitance, and maintain a desired $Z_0$ around 50 ohms, the additional inductance of the spiral trace $L_2$ can be tuned by selecting an appropriate design. Total impedance can thus straightforwardly be set to 50 ohms, or to any other appropriate value, by selecting an appropriate $L_2$, such as by selecting a spiral trace design with an appropriate material, cross-sectional area, number and density of winds, and/or total overall length for spiral trace 49. For illustrative purposes only, exemplary embodiments of the spiral trace 49 are set forth below.

In some embodiments, the spiral trace 49 may be made of the same material as traces 42, 43, 44, 47, 48. However, it should be appreciated that any appropriate electrically conductive material, such as copper or the like, may be used.

Figure 3A:
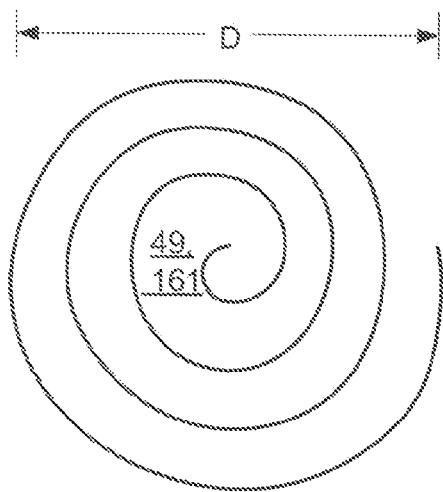
FIGS. 3A-3D are top views of a spiral inductor according to exemplary embodiments, along line 3-3 of FIG. 6.
Figure 3B:
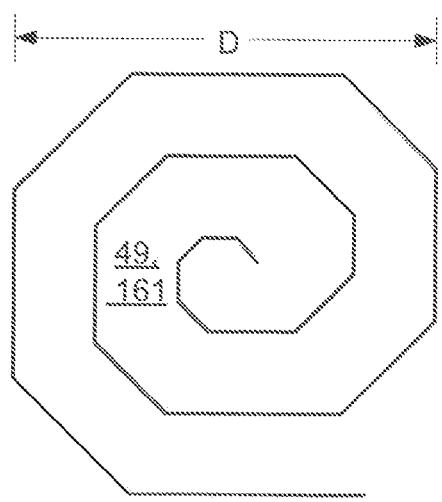
Figure 3C:
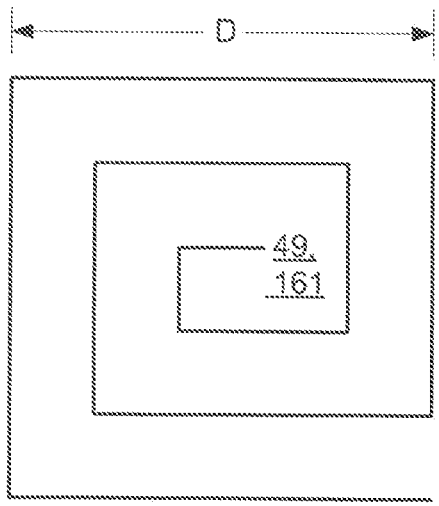
Figure 3D:
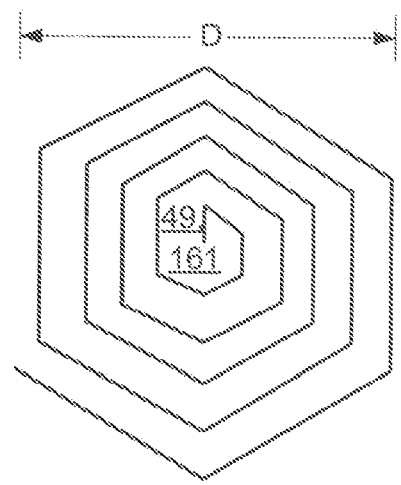

Referring to FIGS. 3A-3D, in some embodiments, spiral trace 49 may include a substantially circular spiral such as that shown in FIG. 3A, and/or it may include a polygonal spiral such as those shown in FIGS. 3B-3D or the like, i.e., octagonal (FIG. 3B), square (FIG. 3C), or hexagonal (FIG. 3D). Using current substrate preparation techniques, polygonal spirals such as those shown in FIGS. 3B-3D may be easier to manufacture than rounded spirals such as that shown in FIG. 3A, but it should be appreciated that the disclosure herein is not limited to any particular shape(s). In some embodiments, the spiral trace 49 may have an outer diameter or width D of between approximately 300-1000 µm. For example, in some embodiments, a spiral having a trace width of 30 µm, 3 windings, and an outer diameter of 800 µm may exhibit an inductance of approximately 1 nH.

In some embodiments, referring to FIG. 4A, the spiral trace 49 may have a total unwound length L of between approximately 2000-8000 µm. As is evident from FIGS. 3A-3D, while the length L can be much larger than the length of a typical trace, the footprint need not be any larger. In some embodiments, referring to FIGS. 4B and 4C, the spiral trace 49 may have a round (4B) or polygonal (4C) cross-section.

Referring again to FIG. 1, in some embodiments, the spiral trace 49 may be formed in a layer near the solder ball 52, and, in some embodiments, may be formed in the bottom layer 29.

The semiconductor package may be designed in accordance with a method illustrated in FIG. 5. The method 500 begins by designing the substrate 20 and the package as a whole, at 502. $C_1$ (capacitance of vias and traces), $C_2$ (capacitance of the solder ball), and $L_1$ (inductance of the vias and traces other than the spiral trace) are then calculated for the package, at 504. A desired $Z_0$ (impedance of the package) is selected, at 506. These values are then used, along with the following equation $$L_2 = Z_0^2(C_1+C_2) - L_1$$

to calculate the desired $L_2$, at 508. Once the desired $L_2$ is determined, the spiral trace can be designed by selecting appropriate values for D (outer diameter or width), L (unwound length), and d (cross-sectional diameter or width), number of windings n, and an appropriate material and shape for the spiral, at 510.

While the embodiments described above are used to adjust the package's impedance, the embodiments described below in relation to FIGS. 6-10 are used to compensate for excess capacitance of one or more semiconductors in the package. As with the embodiments described above, the embodiments described below provide a spiral trace on or in one or more substrate layers of an IC package. However, in the embodiments described below, the spiral trace or inductor is disposed near an IC die of the package, to act as an inductor to compensate for the capacitive loading (Ci) of the die by cooperating with the capacitance to establish a desired characteristic impedance. By "near" it is meant that the spiral trace is at, close, or within a short distance from the IC die. In some embodiments, a suitable distance is about 200 um or less. The spiral inductor takes up very little area, and its ends (input and output) are located near one another. During the design of the package, the characteristics of the spiral are chosen so as to provide a desired inductance. This inductance provides a desired impedance of the package as a whole.

In particular, the die generally has a capacitance $C_i$. This leads to the package structure having a low impedance caused by the high capacitance of the die:

$$Z_0 = \sqrt{\frac{L}{C_i}}$$

where:
$Z_0$ is the impedance;
L is the inductance; and
$C_i$ is the capacitance of the die.

Therefore, the high capacitance of the die and a low impedance in the overall signal path tend to cause undesirable impedance mismatches in the package, especially between the die and the substrate.

To address this impedance mismatch, some embodiments provide a package that includes a substrate having multiple layers, from a first layer to a final layer. A die is coupled to the first layer. An electrical connector is coupled to the final layer. A spiral trace is disposed in or on the substrate near the die. The spiral trace is electrically coupled between the die and the electrical connector. In use, the electrical connector is physically and electrically connected to a PCB.

The interconnect path between the electrical connector and the die is composed of electrically conductive inductors or signal traces ("traces") and electrically conductive vias. In general, the traces are disposed substantially horizontally on or between the various substrate layers, i.e., substantially parallel to the planar surfaces of the substrate, while the vias are disposed substantially vertically through the layers, i.e., substantially perpendicular to the planar surfaces of the substrate.

Some of the embodiments described herein also provide a spiral trace disposed on or within the die, to provide further inductance. The additional spiral trace may be disposed around, and electrically connected to, an electrical connector on the die, such as a solder pad, that electrically connects the die to a solder bump or ball, such as a C4 solder ball.

As described above with respect to FIGS. 1-5, some of the embodiments also provide a spiral trace near the PCB, and configured to address capacitance of the solder ball that connects the package to the PCB and any resulting impedance mismatches between the package and the PCB.

As shown in FIG. 6, a semiconductor package 110 includes a die pad 132 of a substrate 140 that may be physically and electrically connected to a contact pad 122 of an IC die 120. This is accomplished through, for example, a solder ball 130 or solder bump (not shown). In some embodiments, die 120 is a memory die. Also, in some embodiments, the contact pad 122 is a high-speed input and/or output port of the die 120. Similarly, a solder ball 170 or solder bump (not shown) physically and electrically connects a contact pad 167 to a contact pad 182 on a PCB 180. These solder balls or bumps will typically be applied to the IC die 120 and the substrate 140 before the package is assembled. Although not shown, dielectric potting material may be under-filled between the die and the substrate.

In some embodiments, the substrate 140 includes a number of dielectric layers. Specifically, in the embodiment shown, the substrate 140 includes: two upper dielectric buildup layers 141, 142, a dielectric core layer 144, and two lower dielectric buildup layers 146, 147. It should be appreciated that other embodiments of the substrate may include different numbers and arrangements of dielectric layers. Micro-vias (also called build-up vias) 151, 152 respectively, may be disposed within the upper buildup layers 141, 142. Similarly, micro-vias 156, 157 may be disposed within the lower buildup layers 146, 147. A core via 154 may be disposed within the core layer 144. The substrate, dielectric layers, conductive layers or traces, micro-vias, and vias are similar to those described above with respect to FIG. 1. It should be appreciated that other embodiments may include any suitable number and arrangement of dielectric layers, conductive layers, vias, micro-vias, or the like.

With respect to the specific interconnections of the trace/via path, in the embodiment illustrated in FIG. 6, micro-via 151 is connected to micro-via 152 through a spiral trace 161, as described below; micro-via 152 is connected to core via 154 by trace 162; core via 154 is connected to micro-via 156 by trace 164; and micro-via 156 is connected to micro-via 157 by a spiral trace 166.

Additionally, the micro-via 151 closest to the die 120, is connected to the substrate die pad 132. In the illustrated embodiment, the micro-via 151 is connected directly to the substrate die pad 132, but in other embodiments, the micro-via 151 could also be connected to the pad 132 by a trace on the upper surface of the layer 141, or the like. Substrate die pad 132 is connected to an electrical connector between the die and the substrate, such as a C4 solder ball 130, which, in turn, is connected to die contact pad 122.

In some embodiments, contact pad 122 is connected to the remainder of the die 120 through an additional spiral trace 124, as described below and shown in various embodiments in FIGS. 7A-7C. In addition, the lowermost micro-via 157 is connected to the contact pad 167 of the substrate 140, which, in turn, is connected to contact pad 182 of the PCB 180 via a solder ball 170 or a solder bump (not shown).

In some embodiments, a second additional spiral trace is provided near the PCB 180. For example, trace 166 may be a spiral trace, or other spiral inductor, as illustrated in FIG. 6. Such an additional spiral trace may address impedance mismatches between the substrate 140 and the PCB 180, as discussed above in relation to FIGS. 1-5.

Having generally described the substrate 140 and the trace/via path, various parameters will now be described for constructing a substrate 140 including a model trace/via path. This model trace/via path achieves an overall impedance of approximately 25-75 ohms for single-ended signaling, or 50-150 ohms for differential signaling, while still maintaining a relatively narrow trace/via path topology.

The impedance of the die is determined primarily by the effective capacitive device loading which is not a constant value.

Figure 8A:
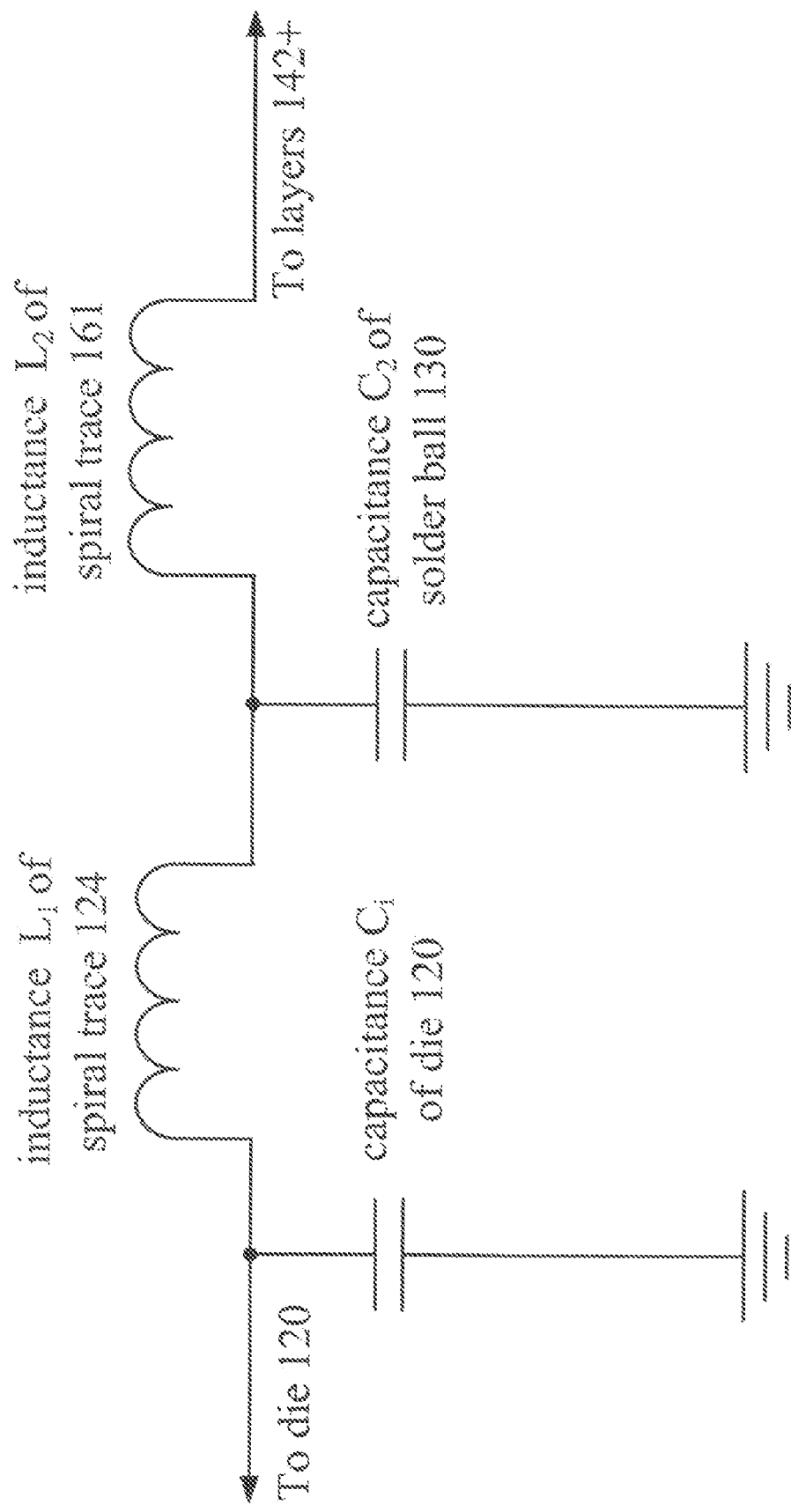
FIGS. 8A and 8B are schematic diagrams showing the electrical characteristics of two exemplary embodiments.
Figure 8B:
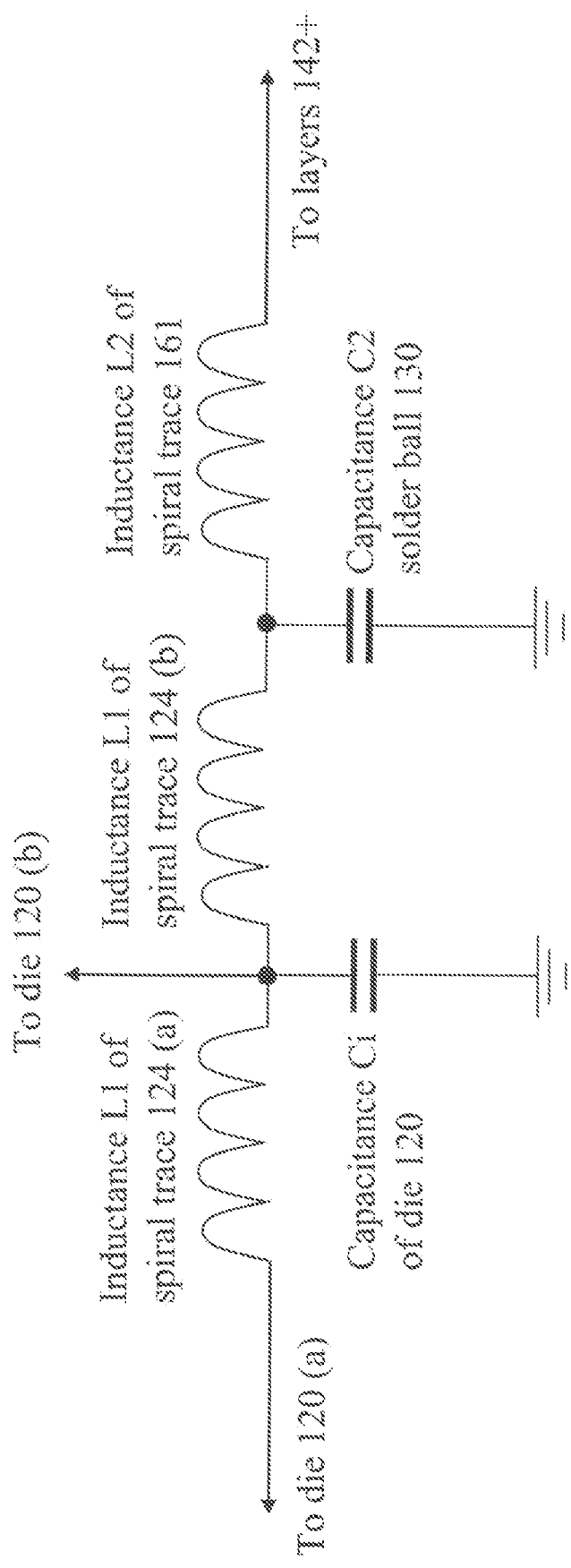

The electrical characteristics of the structure of FIG. 6 can be represented by the circuit shown schematically in FIG. 8A (see also FIG. 8B). The impedance of the structure is thus $$Z_0 = \sqrt{\frac{L_1 + L_2}{C_i + C_2}}$$

where:
$Z_0$ is the impedance;
$L_1$ is the inductance of the spiral trace 124;
$L_2$ is the inductance of the spiral trace 161;
$C_i$ is the capacitance of the die 120; and
$C_2$ is the capacitance of the solder ball 130.

Generally, $C_i$ and $C_2$ are often fixed, with $C_i$ often comprising a relatively large capacitance. Therefore to compensate for the undesirably large $C_i$ capacitance, and maintain a desired $Z_0$ around 50 ohms, the additional inductance of the spiral traces $L_1$ and $L_2$ can be tuned by selecting an appropriate design. Total impedance can thus straightforwardly be set to 50 ohms, or to any other appropriate value, by selecting appropriate values for $L_1$ and $L_2$, such as by selecting spiral trace designs with appropriate materials, cross-sectional areas, number and density of winds, and/or total overall lengths for spiral traces 124, 161.

In some embodiments, the spiral trace 161 may be made of the same material as traces 162, 164, 166, 167. However, it should be appreciated that any appropriate electrically conductive material, such as copper or the like, may be used. Exemplary embodiments of the spiral inductors 124, 161 are similar to those described above in relation to FIGS. 3A-3D and 4A-4C.

The spiral trace 161 may be formed in a layer near the die 120, and, in some embodiments, may be formed on or in the top layer 141 of the substrate 140. The spiral trace 161 may have an outer diameter or width D of between approximately 100-300 μm. For example, in some embodiments, a spiral having a trace width of 25 μm, 2 windings, and an outer diameter of 250 μm may exhibit an inductance of approximately 0.5 nH. The spiral trace 161 may also have a total unwound length L of between approximately 300-1000 μm.

Spiral inductor 124, however, may be formed in silicon, i.e., formed together with the remainder of the IC die. As such, the dimensions and shape of the spiral inductor 124 may be limited by the processing characteristics and limitations of the IC die 120. For example, in some embodiments, spiral trace 124 may include a polygonal spiral such as those shown in FIGS. 7A-7B or the like, i.e., square (FIG. 7A), or hexagonal (FIG. 7B), and/or it may include a substantially circular spiral such as that shown in FIG. 7C. Using semiconductor manufacturing processes, polygonal spirals such as those shown in FIGS. 7A-7B may be easier to manufacture than rounded spirals such as that shown in FIG. 7C, but it should be appreciated that the disclosure herein is not limited to any particular shape(s). The spiral trace 124 may have an outer diameter or width D of between approximately 20-60 μm. For example, in some embodiments, a spiral having a trace width of 2 μm, 3 windings, and an outer diameter of 50 μm may exhibit an inductance of approximately 0.5 nH. The spiral trace 161 may also have a total unwound length L of between approximately 100-300 μm. In some embodiments, the spiral trace 124 may have a round or polygonal cross-section.

Referring again to FIG. 6, in some embodiments, the spiral trace 124 may be formed in or on the die 120, and, in some embodiments, referring also to FIGS. 7A-7C, may be formed around the solder pad 122. Various spirals for inputs and/or outputs of the IC die may be formed beneath one another, similar to the manner described below with respect to FIG. 9.

Figure 10:
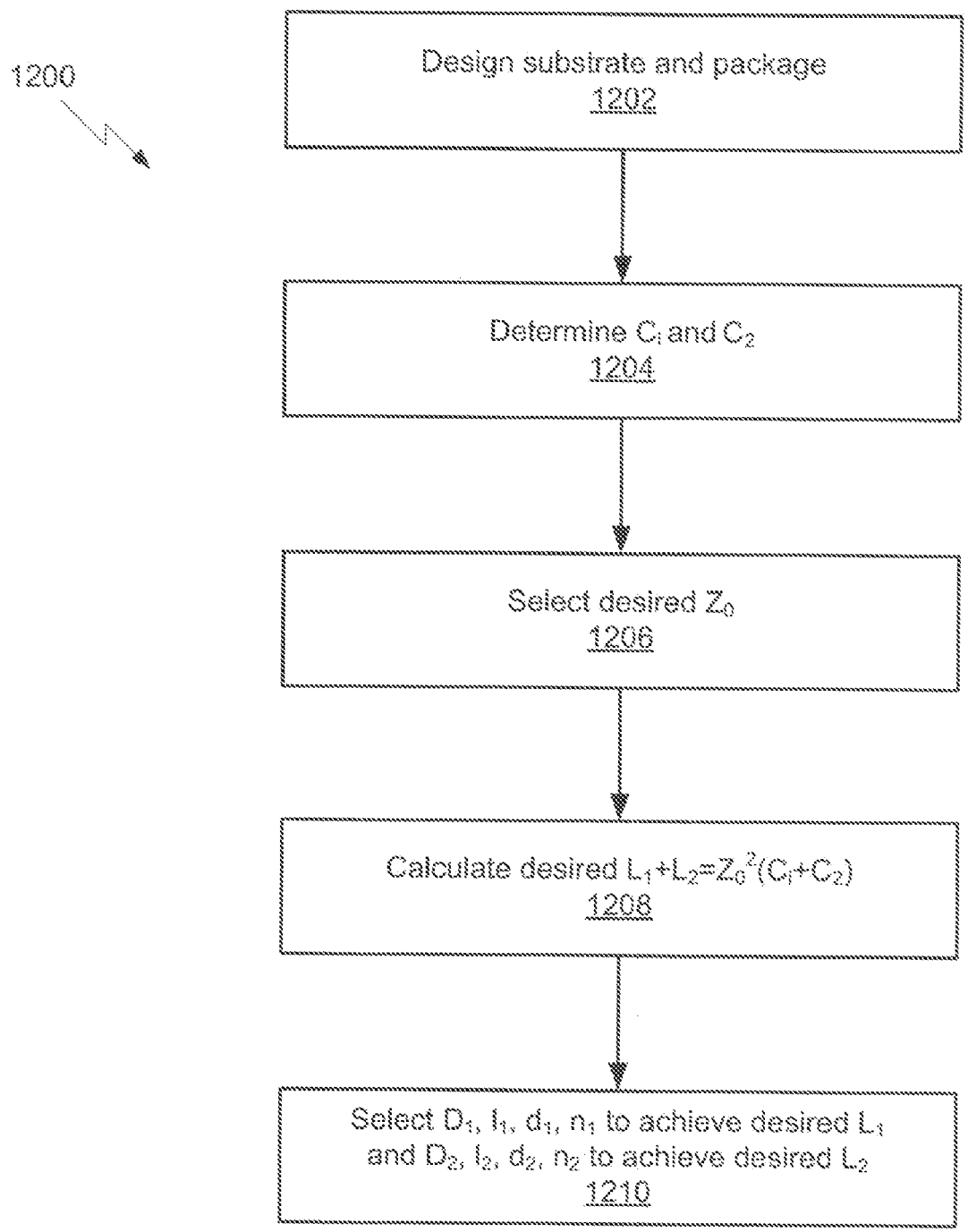
FIG. 10 is a flowchart depicting an exemplary design process of a semiconductor package according to exemplary embodiments.

The semiconductor package may be designed in accordance with a method illustrated in FIG. 10. The method 1200 begins by designing the substrate 140 and the package as a whole, at 1202. $C_i$ (capacitance of the die 120) and $C_2$ (capacitance of the solder ball 130) are then calculated for the package, at 1204. A desired $Z_0$ (impedance of the package) is selected, at 1206. These values are then used, along with the following equation to calculate the desired $L_1$ and $L_2$, at 1208:

$$L_1 + L_2 = Z_0^2 (C_i + C_2)$$

Once the desired $L_1$ and $L_2$ are determined, the spiral traces 124, 161 can be designed by selecting appropriate values for D (outer diameter or width), L (unwound length), and d (cross-sectional diameter or width), number of windings n, and an appropriate material and shape for the spirals, at 1210.

In some embodiments, a second additional spiral trace is provided in or on a layer near the solder ball 170. These embodiments are described in detail above with respect to FIGS. 1-5. As will be apparent to those of ordinary skill in the art, any number of spiral traces may be provided at any combination of locations, and their inductances $L_1, L_2, \ldots L_n$ can be solved for by minor modifications, apparent to those of ordinary skill in the art. It is contemplated that any number of capacitances and their associated inductances can be compensated for by selecting appropriate designs and placements of spiral traces in any number or configuration that can be selected by persons of ordinary skill in the art.

Figure 9:
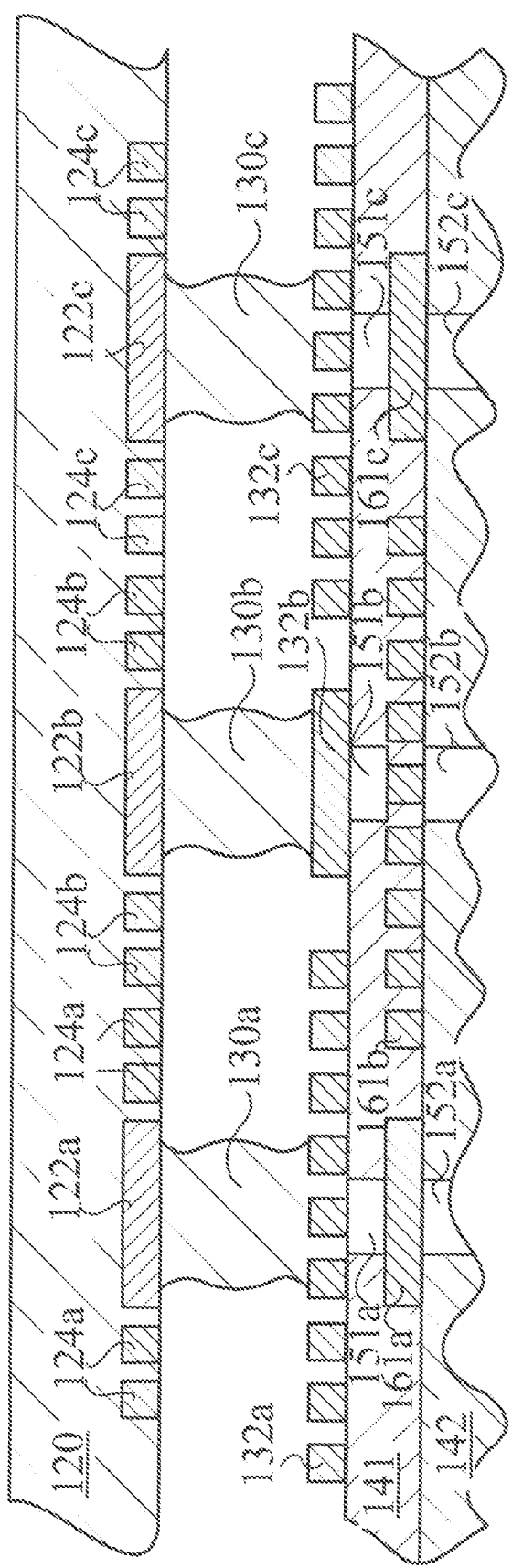
FIG. 9 is another cross-sectional view of a package structure according to yet another exemplary embodiment.

FIG. 9 shows another cross-sectional view of a package structure according to another exemplary embodiment. In some embodiments, several solder balls 130a-130c are provided. Each solder ball 130a-130c may connect to a different contact pad 122a-122c of the die 120, through a different electrical path 132a→151a→161a→152a-132c→151c→161c→152c, to a different solder pad 167 on the final layer, and to a different place on the PCB 180. In some of these embodiments, the additional spiral trace is disposed on (or in) alternating layers for each associated electrical path a-c. For example, in the illustrated embodiment, the spiral traces 132a, 132c are on the top surface of the top layer 141 for electrical paths a and c, and traces 161a, 161c are non-spiral traces; while for electrical path b, spiral trace 161b is disposed in (or on) the bottom of the top layer 141, while solder pad 132b is non-spiral. As can be seen in FIG. 9, in some embodiments, this staggering allows several electrical paths to be positioned very near each other, without the spiral traces 132a, 161b, 132c interfering with one another.

In light of the above, it is clear that the above described spiral inductors may be used to offset the capacitance of the semiconductor device (or IC die) in the package. In other embodiments, multiple die in any arrangement, such as stacked die, may be provided within the package. Also, the substrate and die(s) may be enclosed in single package housing.

The preceding description sets forth various implementations and embodiments. The implementations and embodiments described incorporate various elements and/or operations recited in the appended claims. The implementations and embodiments are described with specificity in order to meet statutory requirements. However, the description itself is not intended to limit the scope of this patent. Rather, the inventors have contemplated that the claimed invention might also be implemented in other ways, to include different elements and/or operations or combinations of elements and/or operations similar to the ones described in this document, in conjunction with other present or future technologies.

What is claimed is:

1. A semiconductor package, comprising:
 a substrate having multiple layers, from a first layer to a final layer;
 a die coupled to the first layer;
 an electrical connector coupled to the final layer; and
 a spiral trace disposed on or in the substrate near the die and forming at least part of an electrical path coupling the die and the electrical connector, wherein the spiral trace has an inductance that is configured to compensate for a capacitance of the die.

2. The semiconductor package of claim 1, wherein the spiral trace has a number of windings that corresponds to a desired inductance that compensates for the capacitance of the electrical connector.

3. The semiconductor package of claim 1, further comprising at least one via extending through at least one of the multiples layers and positioned along the electrical path.

4. The semiconductor package of claim 3, wherein the at least one via includes a core via and one or more micro-vias.

5. The semiconductor package of claim 1, wherein the electrical connector comprises a solder ball.

6. The semiconductor package of claim 1, wherein the package has an impedance of approximately 50 ohms.

7. The semiconductor package of claim 1, wherein the package has a differential impedance of approximately 100 ohms.

8. The semiconductor package of claim 1, wherein the die is a memory die.

9. The semiconductor package of claim 1, wherein the spiral trace is selected from the group consisting of: a circular spiral, oval spiral, hexagonal spiral, and octagonal spiral.

10. The semiconductor package of claim 1, wherein the spiral trace has an outer diameter of between approximately 300-1000 μm.

11. The semiconductor package of claim 1, wherein the spiral trace has a length of between approximately 2000-8000 μm.

12. The semiconductor package of claim 1, wherein the spiral trace is formed in or on the first layer.

13. The semiconductor package of claim 1, further comprising a solder ball electrically connecting the die to the spiral trace.

14. The semiconductor package of claim 13, wherein the die is a flip-chip die and the solder ball is a C4 solder ball.

15. The semiconductor package of claim 13, further comprising an additional spiral trace disposed between, and electrically connecting, the die and the solder ball.

16. The semiconductor package of claim 15, wherein the additional spiral trace has an inductance of approximately 0.5 nH.

17. The semiconductor package of claim 15, wherein the additional spiral trace has an inductance that is configured to compensate for a capacitance of the die.

18. The semiconductor package of claim 17, wherein the additional spiral trace is disposed on or in the die.

19. The semiconductor package of claim 1, wherein the spiral trace has an inductance of approximately 0.5 nH.

20. The semiconductor package of claim 1, further comprising an additional spiral trace, in or on the substrate, disposed near the electrical connector and electrically coupled between the spiral trace and the electrical connector.

21. The semiconductor package of 20, wherein the additional spiral trace is formed in or on the final layer.

22. A semiconductor package, comprising:
 a substrate having multiple layers 1 to n;
 a memory die connected to the 1st layer of the multiple layers;
 a solder ball connected to the nth layer of the multiple layers;
 one or more vias in each layer 1 to (n−1);
 an electrical path between the solder ball and the die at least partially formed by said vias; and
 a spiral trace having a number of windings formed in or on the 1st layer of the substrate along the electrical path, wherein the spiral trace has a number of windings that correspond to an inductance that compensates for the capacitance of the memory die.

23. A semiconductor package, comprising:
 a substrate having multiple layers;
 a memory storage means coupled to a first layer of the multiple layers;
 an electrical connecting means coupled to a final layer of the multiple layers;

at least one means for transmitting electricity through the layers from the electrical connecting means to the memory storage means; and a spiral trace disposed in or on the substrate near the memory storage means along the means for transmitting electricity, wherein the spiral trace has a number of windings that correspond to an inductance that compensates for the capacitance of the memory storage means.

24. A method for designing a semiconductor package comprising:
selecting a substrate having 1–n layers;
selecting a die to attach to a 1st layer of the 1–n layers;
selecting a first electrical connector to attach to an nth layer of the 1–n layers;
selecting one or more vias formed through at least one layer of the 1–n layers along an electrical path formed between the die and the first electrical connector;
selecting one or more traces along the electrical path;
determining capacitance of the vias, traces, and first electrical connector;
determining inductance of the vias and traces;
selecting a desired impedance of the semiconductor package;
selecting a spiral trace to be formed near the first electrical connector in or on the nth layer along the electrical path formed between the die and the first electrical connector, where the spiral trace has an inductance that is based on the: (i) the capacitance of the vias, traces, and first electrical connector, (ii) the inductance of the vias and traces, and (iii) the desired impedance of the semiconductor package;
selecting a second electrical connector to connect the die to the substrate, where the second electrical connector also forms at least part of the electrical path between the die and the first electrical connector;
determining capacitance of the die and the second electrical connector; and
selecting an additional spiral trace to be formed near the die, where the additional spiral trace has an inductance that is based on: (i) the capacitance of the die and the second electrical connector, and (ii) the desired impedance of the semiconductor package.

25. The method of claim 24, wherein the inductance of the spiral trace is calculated using the following equation:

$$L_2 = Z_0^2(C_1+C_2) - L_1,$$

where $C_1$ is the capacitance of the vias and traces, $C_2$ is the capacitance of the first electrical connector, $L_1$ is the inductance of the vias and traces, $Z_0$ is the desired impedance of the semiconductor package, and $L_2$ is the inductance of the spiral trace.

26. The method of claim 25, wherein the inductance of the spiral trace is achieved by selecting appropriate values selected from a group consisting of: an outer diameter of the spiral trace; an outer width of the spiral trace; an unwound length of the spiral trace; a cross-sectional diameter, width, or area of the spiral trace; a number of windings of the spiral trace; a material of the spiral trace; a shape for the spiral trace; and any combination of the aforementioned.

27. The method of claim 24, wherein the inductance of the additional spiral trace is calculated using the following equation:

$$L_1 + L_2 = Z_0^2(C_i + C_2),$$

where $C_i$ is the capacitance of the die, $C_2$ is the capacitance of the second electrical connector, $Z_0$ is the desired impedance of the semiconductor package, and $L_1+L_2$ is the inductance of the additional spiral trace.

28. The method of claim 27, wherein $L_1$ is the inductance of a first spiral trace formed on a die side of the second electrical connector, and $L_2$ is the inductance of a second spiral trace formed in or on the 1st layer of the substrate.

29. The method of claim 28, wherein the inductance of the additional spiral trace is achieved by selecting appropriate values selected from a group consisting of: an outer diameter of the additional spiral trace; an outer width of the additional spiral trace; an unwound length of the additional spiral trace; a cross-sectional diameter, width, or area of the additional spiral trace; a number of windings of the additional spiral trace; a material of the additional spiral trace; a shape for the additional spiral trace; and any combination of the aforementioned.

* * * * *